(12) United States Patent
Allison et al.

(10) Patent No.: US 7,732,998 B2
(45) Date of Patent: Jun. 8, 2010

(54) TELESCOPING CYLINDRICAL PIEZOELECTRIC FIBER COMPOSITE ACTUATOR ASSEMBLIES

(75) Inventors: Sidney G. Allison, Williamsburg, VA (US); Qamar A. Shams, Yorktown, VA (US); Robert L. Fox, Hayes, VA (US); Christopher L. Fox, legal representative, Yorktown, VA (US); Melanie L. Fox Chattin, legal representative, Hayes, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 417 days.

(21) Appl. No.: 11/462,114

(22) Filed: Aug. 3, 2006

(65) Prior Publication Data
US 2010/0118405 A1 May 13, 2010

(51) Int. Cl.
*H01L 41/04* (2006.01)
*H01L 41/08* (2006.01)
(52) U.S. Cl. ..................... 310/369; 310/365
(58) Field of Classification Search .............. 310/358, 310/367–369
See application file for complete search history.

(56) References Cited

U.S. PATENT DOCUMENTS

| | | | | |
|---|---|---|---|---|
| 4,613,784 A | * | 9/1986 | Haun et al. | 310/358 |
| 4,876,776 A | * | 10/1989 | Whatmore et al. | 29/25.35 |
| 5,323,082 A | * | 6/1994 | Wright | 310/328 |
| 5,660,877 A | * | 8/1997 | Venkataramani et al. | 427/100 |
| 5,818,149 A | * | 10/1998 | Safari et al. | 310/358 |
| 6,545,395 B2 | * | 4/2003 | Matsui et al. | 310/369 |
| 6,629,341 B2 | | 10/2003 | Wilkie et al. | |
| 6,940,213 B1 | * | 9/2005 | Heinz et al. | 310/366 |
| 7,400,080 B2 | * | 7/2008 | Benslimand et al. | 310/369 |
| 7,580,323 B2 | * | 8/2009 | Allison et al. | 367/140 |
| 2002/0038990 A1 | | 4/2002 | Horner et al. | |
| 2003/0056351 A1 | * | 3/2003 | Wilkie et al. | 29/25.35 |
| 2003/0219191 A1 | * | 11/2003 | Kehlenbach | 385/12 |
| 2004/0183401 A1 | | 9/2004 | Lubitz et al. | |
| 2005/0073218 A1 | | 4/2005 | Topliss et al. | |
| 2007/0091724 A1 | * | 4/2007 | Allison et al. | 367/149 |
| 2007/0262679 A1 | * | 11/2007 | Maruyama et al. | 310/369 |

OTHER PUBLICATIONS

Diann Brei, John Halloran, and Neal Berner, "High Authority Piezoceramic Telescoping Actuator," Project Summary for Defence Advanced Research Project Agency (DARPA), Jul. 1997.

(Continued)

*Primary Examiner*—J. SanMartin
(74) *Attorney, Agent, or Firm*—Robin W. Edwards (57) ABSTRACT

A telescoping actuator assembly includes a plurality of cylindrical actuators in a concentric arrangement. Each cylindrical actuator is at least one piezoelectric fiber composite actuator having a plurality of piezoelectric fibers extending parallel to one another and to the concentric arrangement's longitudinal axis. Each cylindrical actuator is coupled to concentrically-adjacent ones of the cylindrical actuators such that the plurality of cylindrical actuators can experience telescopic movement. An electrical energy source coupled to the cylindrical actuators applies actuation energy thereto to generate the telescopic movement.

15 Claims, 6 Drawing Sheets

OTHER PUBLICATIONS

Paul W. Alexander and Diann Brei, "Piezoceramic Telescopic Actuator Quasi-Static Experimental Characterization," Journal of Intelligent Material System and Structures, 2003, vol. 14 ( No. 10), p. 643-655.

Urban Simu, "Piezoactuators for Miniature Robots," Dissertation for Ph.D., Uppsala University, Sweden, 2002.

R. Brett Williams and Daniel J. Inman, "An Overview of Composite Actuators with Piezoceramic Fibers," Proc. 20th International Modal Analysis Conference, Los Angeles, CA 2002.

* cited by examiner

TELESCOPING CYLINDRICAL PIEZOELECTRIC FIBER COMPOSITE ACTUATOR ASSEMBLIES

This invention was made by employees of the United States Government and may be manufactured and used by or for the Government of the United States of America for governmental purposes without the payment of any royalties thereon or therefor.

BACKGROUND OF THE INVENTION

1. Field of the Invention

This invention relates to piezoelectric actuators. More specifically, the invention relates to cylindrically-shaped and telescopically-extending piezoelectric fiber composite actuator assemblies.

2. Description of the Related Art

Piezoelectric fiber composite actuators are flexible, planar actuators that can be bonded to a structure and then operated to generate and control or detect deflections/strain of the structure. A conventional piezoelectric fiber composite actuator has the following structural features:

(i) a layer of individual piezoelectric fibers (e.g., round, square, etc.) arrayed side-by-side and typically encased in a polymer matrix material; and (ii) interdigitated electrodes etched or deposited onto one or two polymer film layers with the resulting layers sandwiching the layer of piezoelectric fibers.

The layer of individual piezoelectric fibers can be assembled from individually-extruded piezoelectric fibers or can be formed from a macro sheet of polymer-backed piezoelectric material that has been processed (e.g., piezoelectric material that has been mechanically diced or etched, laser etched, etc.) to yield parallel rows of piezoelectric material "fibers" attached to the polymer backing. A piezoelectric fiber composite actuator constructed in this fashion is also known as a macro-fiber composite actuator. A complete description of such an actuator is disclosed in U.S. Pat. No. 6,629,341, the contents of which are hereby incorporated by reference.

The piezoelectric fiber/macro-fiber composite actuator is a flat device that is lighter and smaller than hydraulic or gas piston-cylinder actuators/assemblies as well as piezoelectric "stack" actuators/assemblies. However, when not bonded to a structure, piezoelectric fiber/macro-fiber composite actuators tend to buckle when used to generate or detect a strain, displacement or force in the plane of the actuator.

SUMMARY OF THE INVENTION

Accordingly, it is an object of the present invention to provide an actuator assembly using piezoelectric fiber composite actuators.

Another object of the present invention is to provide a piezoelectric fiber composite actuator assembly that exhibits improved stiffness when generating/detecting strain in the plane of the actuator.

Other objects and advantages of the present invention will become more obvious hereinafter in the specification and drawings.

In accordance with the present invention, a telescoping actuator assembly includes a plurality of cylindrical actuators in a concentric arrangement that defines a common longitudinal axis. Each cylindrical actuator is at least one piezoelectric fiber composite actuator having a plurality of piezoelectric fibers extending parallel to one another and to the common longitudinal axis. Each cylindrical actuator is coupled to concentrically-adjacent ones of the cylindrical actuators such that the plurality of cylindrical actuators can experience telescopic movement along the common longitudinal axis of the concentric arrangement. An electrical energy source coupled to the cylindrical actuators applies actuation energy thereto to generate the telescopic movement.

DETAILED DESCRIPTION OF THE INVENTION

Figure 1:
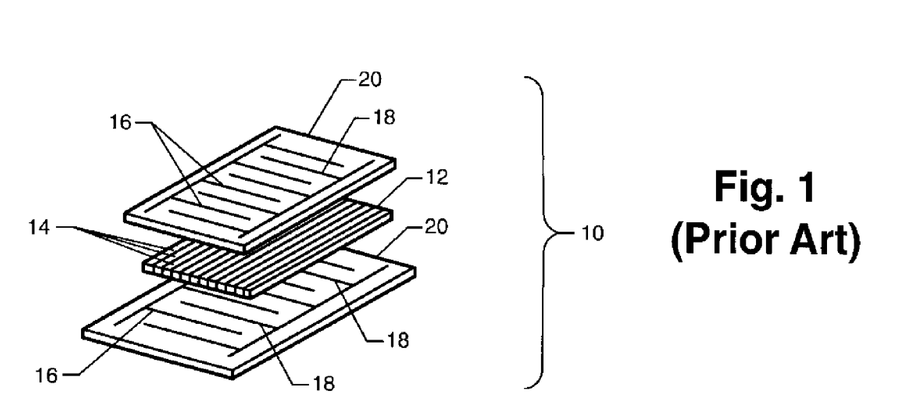
FIG. 1 is an exploded perspective view of a conventional flat piezoelectric fiber composite actuator.

Prior to describing the various cylindrical piezoelectric fiber composite actuator assemblies of the present invention, the basic and conventional piezoelectric fiber composite actuator will be explained with the aid of FIG. 1 where the actuator is referenced generally by numeral 10. Actuator 10 includes a planar layer 12 of individual piezoelectric fibers 14 (e.g., round, square, etc.) arrayed side-by-side and parallel to one another. Typically, layer 12 is encased in a polymer matrix material (not shown for clarity of illustration). Interdigitated electrodes 16/18 are etched or deposited onto one or two (e.g., usually two as in the illustrated example) planar polymer film layers 20 with the resulting layers sandwiching layer 12 of piezoelectric fibers 14. Layer 12 of individual piezoelectric fibers 14 can be assembled from individually-extruded and laid up piezoelectric fibers or can be formed from a macro sheet of polymer-backed piezoelectric material that has been processed (e.g., piezoelectric material that has been mechanically diced or etched, laser etched, etc.) to yield parallel rows of piezoelectric material "fibers" attached to the polymer backing. The resulting piezoelectric fiber composite actuator constructed in this fashion is known as a macro-fiber composite actuator and is disclosed in U.S. Pat. No. 6,629, 341, the contents of which are hereby incorporated by reference. Accordingly, it is to be understood that the phrase "piezoelectric fiber composite actuator" as used herein includes actuators fabricated using individually laid up fibers as well as those processed from a macro sheet of piezoelectric material.

The above-described conventional piezoelectric fiber composite actuator is a flat, flexible device that expands or contracts in the plane thereof with the application of an actuation voltage as is known in the art. In accordance with the present invention, one or more of the above-described actuators is used to form a cylindrical actuator assembly that is self-stiffening in the plane of the actuator(s). Several non-limiting examples of actuator assemblies will be described herein with the aid of FIGS. 2-11. For simplicity, the illustrated examples show circular cylinders. However, the present invention is not so limited as the term "cylindrical" referred to herein is meant to include any closed cylindrical shape such as oblique cylinders, elliptical cylinders, or other non-circular cylinders.

Figure 2:
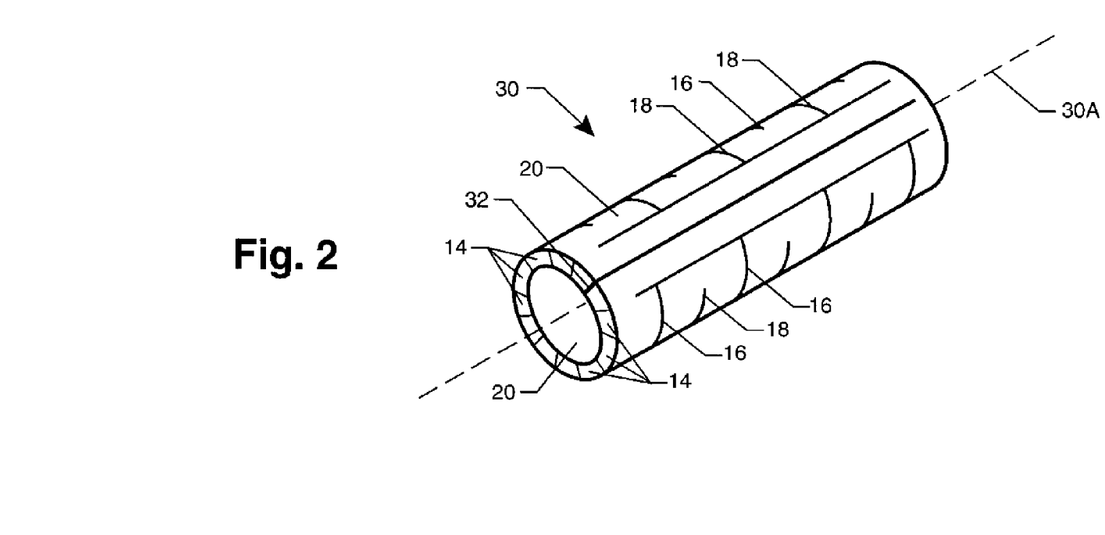
FIG. 2 is a perspective view of a cylindrical piezoelectric fiber composite actuator assembly in accordance with an embodiment of the present invention that utilizes a single piezoelectric fiber composite actuator.

In FIG. 2, a single piezoelectric fiber composite actuator is formed into cylindrical actuator assembly 30 having a central longitudinal axis 30A. For ease of description, it is assumed that the basic construction of previously-described actuator 10 is used in the fabrication of actuator assembly 30. Accordingly, the reference numerals used to define the elements of actuator 10 are repeated in the illustration of actuator assembly 30. The single piezoelectric fiber composite actuator used to fabricate assembly 30 is joined along the outboard edges of layers 20 as indicated by a join line 32. Methods used to join layers 20 along line 32 would be well understood in the art.

Fabrication of actuator assembly 30 could be achieved by either (i) shaping a conventional flat piezoelectric fiber composite actuator into a cylinder (e.g., using a mandrel that is later removed), or (ii) building the cylindrical shape of assembly 30 from its constituent parts a layer at a time on a cylindrical form that would later be removed. The choice of fabrication methodology is not a limitation of the present invention.

The cylindrical shape of actuator assembly 30 is self-stiffened along its longitudinal planes parallel to longitudinal axis 30A. In this way, when activated by actuation energy (e.g., voltage, current, etc.), actuator assembly 30 can extend/retract parallel to longitudinal axis 30A and transmit force without buckling, especially while applying compressive force.

Figure 3:
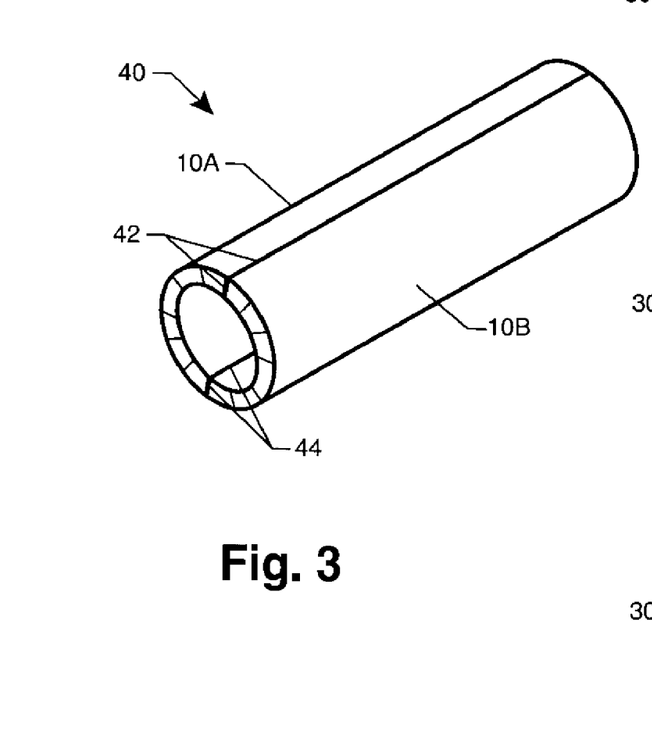
FIG. 3 is a perspective view of a cylindrical piezoelectric fiber composite actuator assembly in accordance with another embodiment of the present invention that utilizes multiple piezoelectric fiber composite actuators.

As mentioned above, there are many ways to construct an actuator assembly in accordance with the teachings of the present invention. For example, rather than using a single piezoelectric fiber composite actuator to form a cylindrical assembly, two or more piezoelectric fiber composite actuators could be used. In FIG. 3, an actuator assembly 40 uses two conventional piezoelectric fiber composite actuators 10A and 10B (i.e., each of which includes the elements previously described for actuator 10). Each of actuators 10A and 10B forms approximately one-half of the cylinder defined by actuator assembly 40, where actuators 10A and 10B are joined to each other along join lines 42 and 44.

Figure 4:
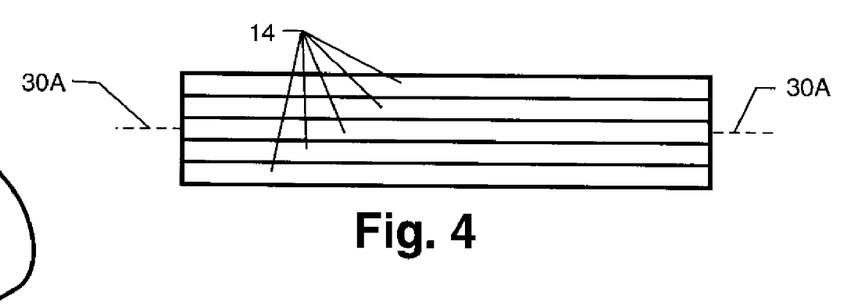
FIG. 4 is a side view of an actuator assembly illustrating the layer of piezoelectric fibers in isolation to show their orientation in accordance with an embodiment of the present invention.
Figure 5:
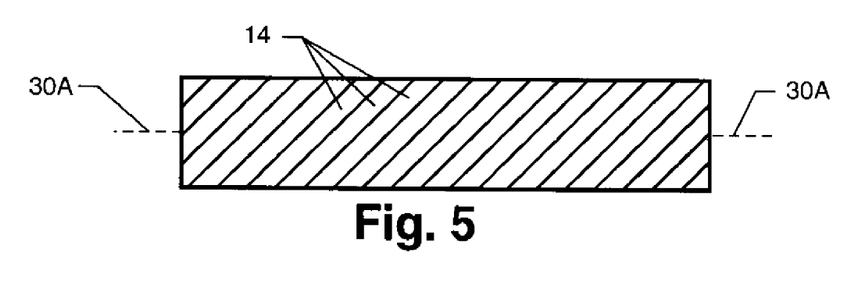
FIG. 5 is a side view of an actuator assembly illustrating the layer of piezoelectric fibers in isolation to show their orientation in accordance with another embodiment of the present invention.
Figure 6:
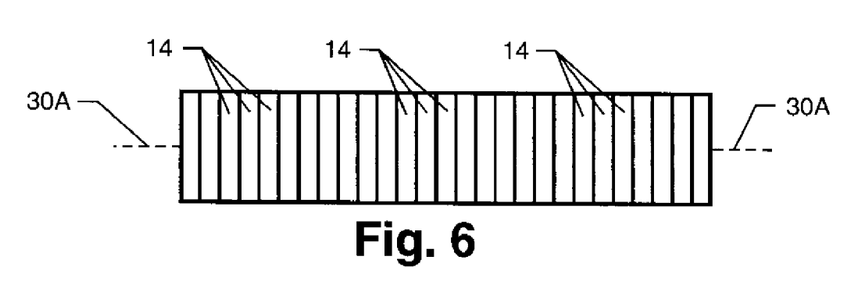
FIG. 6 is a side view of an actuator assembly illustrating the layer of piezoelectric fibers in isolation to show their orientation in accordance with still another embodiment of the present invention.

In each actuation assembly of the present invention, (i.e., constructed from one or more "conventional" piezoelectric fiber composite actuators), the individual piezoelectric fibers 14 can extend in straight parallel lines along the length of the assembly's cylindrical shape such that they are parallel to the cylinder's longitudinal axis. This construction is illustrated in FIG. 4 where a side view of actuator assembly 30 is shown with layers of piezoelectric's fibers 14 being exposed for purposes of illustration. This type of construction will produce the greatest amount of strain parallel to longitudinal axis 30A. However, the present invention is not so limited as piezoelectric fibers 14 could be helically wrapped relative to longitudinal axis 30A as shown in FIG. 5, or could be wrapped about the assembly's cylindrical shape such that they are perpendicularly oriented relative to longitudinal axis 30A as shown in FIG. 6. The helical wrapping of piezoelectric fibers 14 shown in FIG. 5 is useful for generating twisting strain, while the "perpendicular" wrapping of piezoelectric's fibers 14 is useful for generating radial compression/expansion forces.

Figure 7:
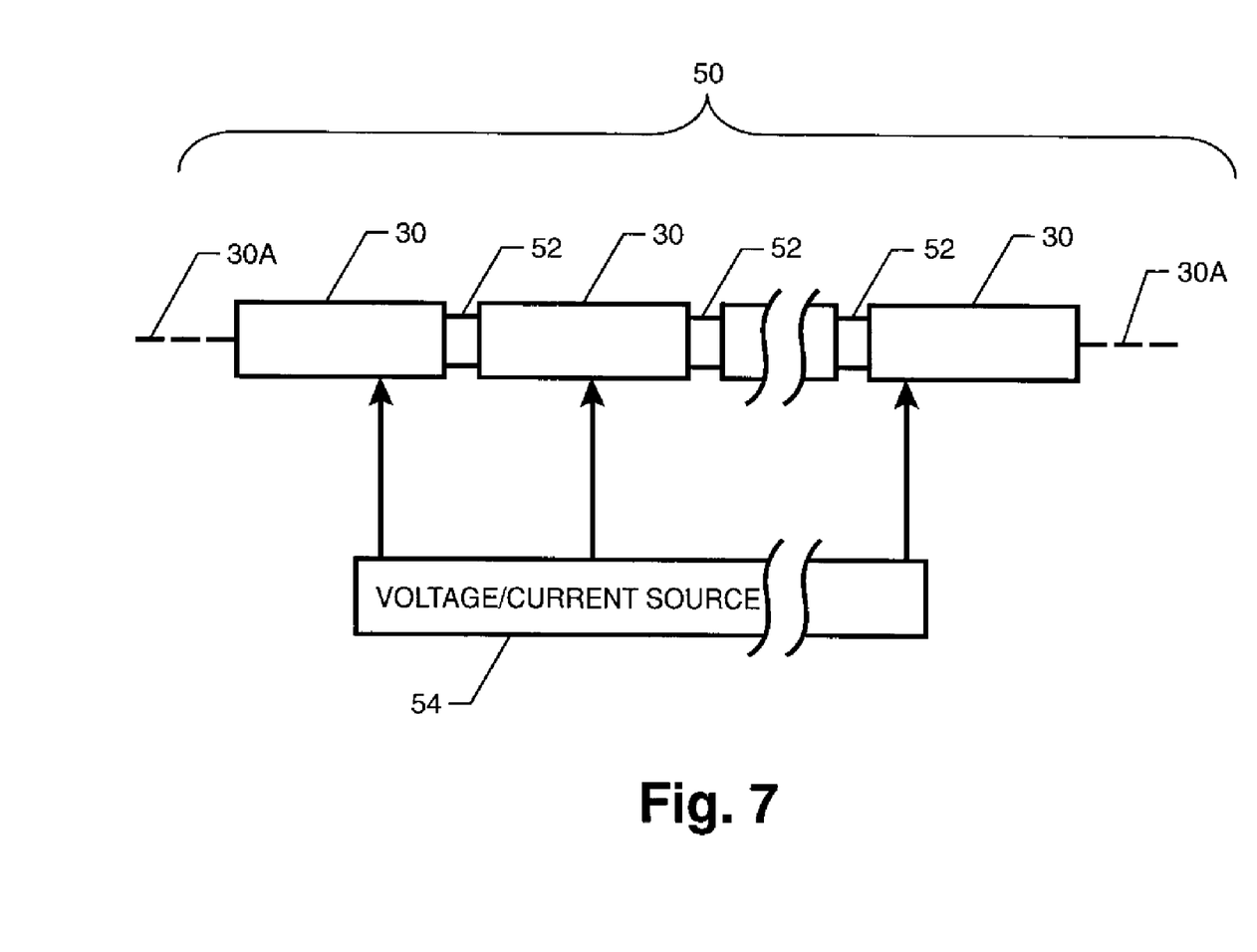
FIG. 7 is a side view of another actuator assembly in accordance with the present invention where multiple, single-cylinder actuator assemblies are arranged in an end-to-end fashion.

Actuator assemblies of the present invention can also include multiples of the actuator assemblies described above. For example, FIG. 7 illustrates an actuator assembly 50 that couples multiple single-cylinder actuator assemblies (e.g., actuator 30) of the present invention in an end-to-end fashion. Individual actuator assemblies 30 are coupled together at their respective ends by flexible or rigid couplings 52. A voltage/current source 54 can be used to apply actuation energy to each of actuator assemblies 30. The actuation energy can be applied independently to each assembly 30 to maximize control of the response of actuator assembly 50.

Figure 8:
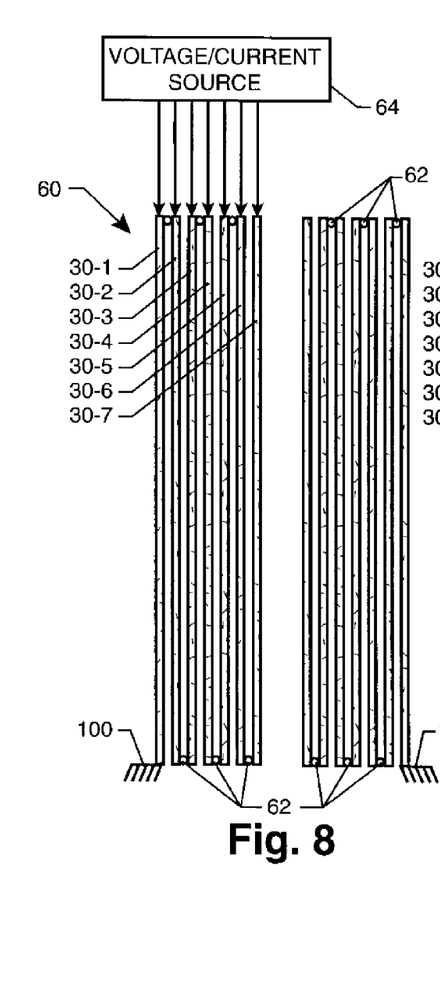
FIG. 8 is a cross-sectional view of another actuator assembly in accordance with the present invention where multiple, single-cylinder actuator assemblies are arranged in a concentric fashion.
Figure 9:
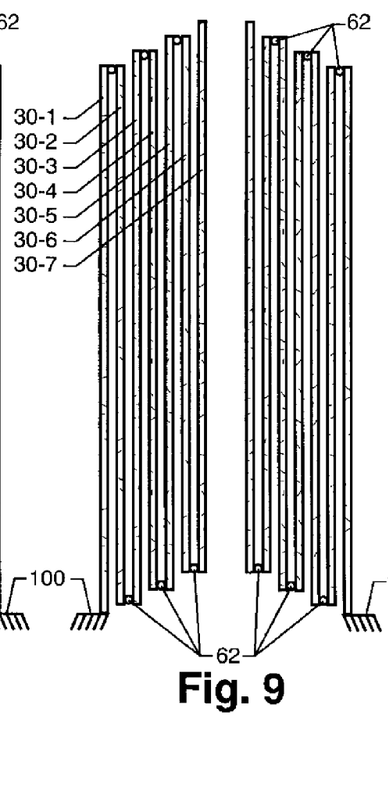
FIG. 9 is a cross-sectional view of the actuator assembly of FIG. 8 after actuation energy has been applied to cause the assembly to telescopically lengthen in a first direction.

The present invention also includes a telescoping type of actuator assembly made from multiple single-cylinder actuator assemblies of the present invention. An example of such an assembly and its operation will be described with the aid of FIGS. 8-10. In FIG. 8, an actuator assembly 60 has multiple single-cylinder actuator assemblies (e.g., actuator assembly 30) arranged concentrically. In the illustrated example, seven actuator assemblies 30 (i.e., assemblies 30-1 through 30-7) are shown, although more or less could be used without departing from the scope of the present invention.

Adjacent ones of actuator assemblies 30 are joined to one another at one end thereof by couplings 62 with the outermost actuator assembly 30-1 being fixed at one end thereof to a base 100. Couplings 62 are provided at alternating ends of assembly 60 to provide for telescoping action. A voltage/current source 64 is provided and can be coupled to actuator assemblies 30-1 through 30-7 in an independent fashion for independent control of each actuator assembly.

Figure 10:
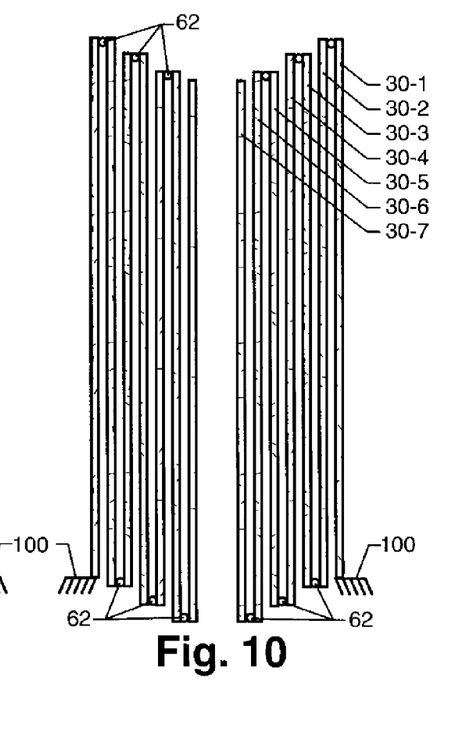
FIG. 10 is a cross-sectional view of the actuator assembly of FIG. 8 after actuation energy has been applied to cause the assembly to telescopically lengthen in a second direction.

In operation, actuator assembly 60 could be activated to telescope in one direction (FIG. 9) or in an opposing direction (FIG. 10). (For clarity of illustration, source 64 and its coupling to actuator assemblies 30-1 through 30-7 has been omitted from FIGS. 9 and 10.) In either case, actuation energy is applied in an alternating polarity fashion to actuator assemblies 30-1 through 30-7. For example, if a positive polarity voltage/current is applied to actuator assemblies 30-1, 30-3, 30-5 and 30-7, then a negative polarity voltage/current is applied to actuator assemblies 30-2, 30-4 and 30-6.

Figure 11:
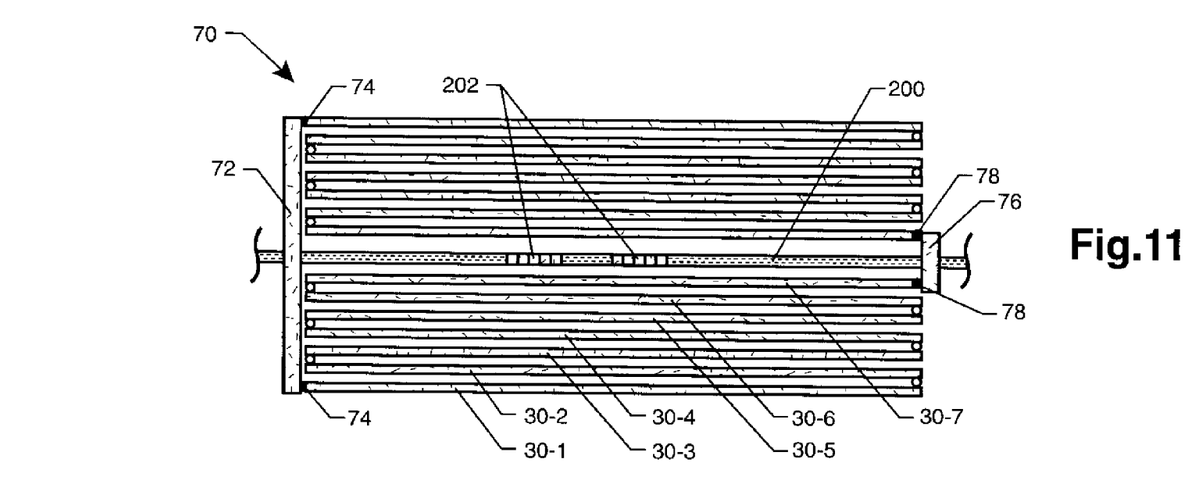
FIG. 11 is a cross-sectional view of another actuator assembly in accordance with the present invention where end caps are coupled to the assembly.

The actuator assemblies described herein can be used in a wide variety of applications without departing from the scope of the present invention. The generated deflections/forces can be applied to devices/systems that lie outside the confines of the actuator assembly. However, the present invention can also be used to apply strain forces to a device/system maintained within the actuator assembly. One such actuator assembly and its application are illustrated in FIG. 11 where an actuator assembly 70 is a concentric arrangement of actuator assemblies 30-1 through 30-7 similar to actuator assembly 60. A first end cap 72 is provided at one axial end of assembly 70 and is fixedly coupled to the outermost actuator assembly 30-1 using, for example, couplings 74. A second end cap 76 is provided at the opposite axial end of assembly 70 and is fixedly coupled to the innermost actuator assembly 30-7 using, for example, couplings 78. A device to be strained (e.g., an optical fiber 200) is fixedly coupled to end caps 72 and 76 where it passes therethrough. (Note that end cap 76 could span and be coupled to more than one of inner ones of actuator assemblies 30-2 through 30-7) When optical fiber 200 (which can incorporate tunable optical elements such as Bragg gratings 202) is to be strained (e.g., for optical tuning thereof), actuation voltage/current is applied to actuator assemblies 30-1 through 30-7 to cause the assembly to telescopically grow in length as previously described. Since optical fiber 200 is fixed at end caps 72 and 76, the telescopic lengthening of assembly 70 provides for the strain tuning of optical fiber 200.

The advantages of the present invention are numerous. The cylindrically-shaped piezoelectric fiber composite actuator assemblies described herein possess all of the inherent advantages of planar piezoelectric fiber composite actuators, but will not buckle when applying forces in the plane of the actuator as the cylindrical shape provides self-stiffening properties.

Figure 12:
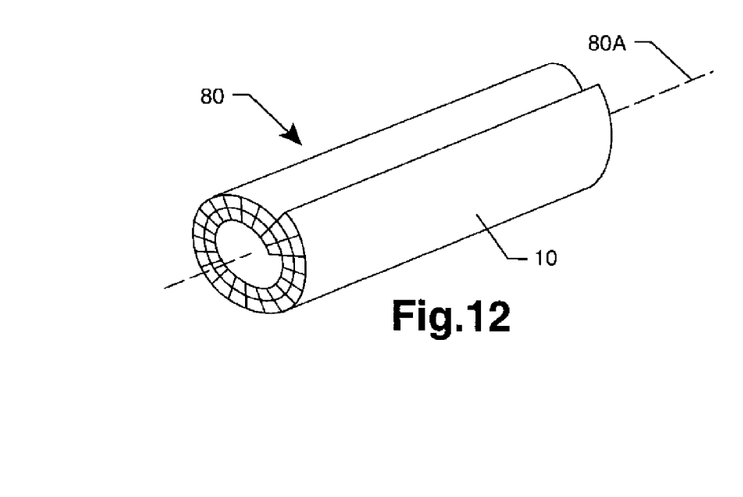
FIG. 12 is a perspective view of a multi-layer cylindrical piezoelectric fiber composite actuator assembly in accordance with another embodiment of the present invention.
Figure 13:
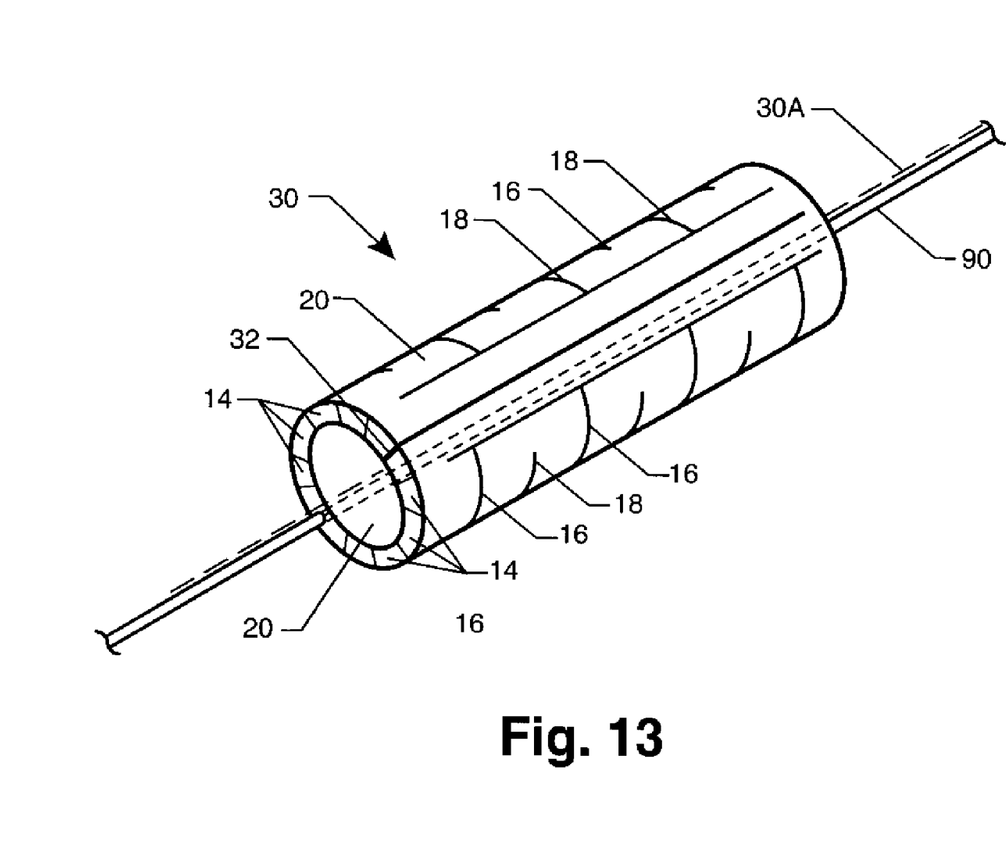
FIG. 13 is a perspective view of a cylindrical piezoelectric fiber composite actuator assembly having an embedded optical fiber sensor.

Although the invention has been described relative to a specific embodiment thereof, there are numerous variations and modifications that will be readily apparent to those skilled in the art in light of the above teachings. For example, the actuator assemblies of the present invention could be fabricated from multiple layers of actuator(s) bonded to one another. As shown in FIG. 12, actuator assembly 80 is made from a single actuator (e.g., actuator 10) wrapped around longitudinal axis 80A two or more times with the wraps being bonded to one another. Obviously, this multi-layer construction could also be achieved with a multiplicity of individual actuators. As another example, the actuator assemblies could have embedded, sandwiched, or otherwise incorporated optical fiber sensors as shown in FIG. 13 (illustrating a single optical fiber 90), such as Bragg gratings, which could be used in applications such as tunable fiber lasers or for measuring actuator strain. It is therefore to be understood that, within the scope of the appended claims, the invention may be practiced other than as specifically described.

What is claimed as new and desired to be secured by Letters Patent of the United States is:

1. A telescoping actuator assembly, comprising:
    a plurality of cylindrical actuators in a concentric arrangement and defining a common longitudinal axis, each of said cylindrical actuators being at least one piezoelectric fiber composite actuator having a plurality of piezoelectric fibers extending parallel to one another and to said common longitudinal axis, each of said cylindrical actuators coupled to concentrically-adjacent ones of said cylindrical actuators such that said plurality of cylindrical actuators can experience telescopic movement along said common longitudinal axis; and
    an electrical energy source coupled to said plurality of cylindrical actuators for applying actuation energy thereto to generate said telescopic movement.

2. A telescoping actuator assembly as in claim 1, further comprising:
    a first cap fixedly coupled to an end of an innermost one of said plurality of cylindrical actuators;
    a second cap fixedly coupled to an end of an outermost one of said plurality of cylindrical actuators, said first cap and said second cap being disposed at opposing ends of said concentric arrangement; and
    a strainable element fixedly coupled to each of said first cap and said second cap, and passing longitudinally through said innermost one of said plurality of cylindrical actuators.

3. A telescoping actuator assembly as in claim 2, wherein said strainable element comprises an optical fiber.

4. A telescoping actuator assembly as in claim 2, wherein said strainable element comprises an optical fiber incorporating at least one optical element that can be tuned using mechanical strain.

5. A telescoping actuator assembly as in claim 2, wherein said strainable element comprises an optical fiber incorporating at least one Bragg grating.

6. A telescoping actuator assembly, comprising:
    a plurality of cylindrical actuators in a concentric arrangement and defining a common longitudinal axis, each of said cylindrical actuators being at least one piezoelectric fiber composite actuator having a plurality of piezoelectric fibers extending parallel to one another and to said common longitudinal axis, each of said cylindrical actuators coupled to an adjacent one of said cylindrical actuators disposed therein and coupled to an adjacent one of said cylindrical actuators disposed thereabout; and
    an electrical energy source coupled to said plurality of cylindrical actuators for independently applying actuation energy thereto to generate telescopic movement of said cylindrical actuators along said common longitudinal axis.

7. A telescoping actuator assembly as in claim 6, further comprising:
    a first cap fixedly coupled to an end of an innermost one of said plurality of cylindrical actuators;
    a second cap fixedly coupled to an end of an outermost one of said plurality of cylindrical actuators, said first cap and said second cap being disposed at opposing ends of said concentric arrangement; and
    a strainable element fixedly coupled to each of said first cap and said second cap, and passing longitudinally through said innermost one of said plurality of cylindrical actuators.

8. A telescoping actuator assembly as in claim 7, wherein said strainable element comprises an optical fiber.

9. A telescoping actuator assembly as in claim 7, wherein said strainable element comprises an optical fiber incorporating at least one optical element that can be tuned using mechanical strain.

10. A telescoping actuator assembly as in claim 7, wherein said strainable element comprises an optical fiber incorporating at least one Bragg grating.

11. A telescoping actuator assembly, comprising:
    a plurality of cylindrical actuators in a concentric arrangement and defining a common longitudinal axis, each of said cylindrical actuators being at least one piezoelectric fiber composite actuator having a plurality of piezoelectric fibers extending parallel to one another and to said common longitudinal axis, each of said cylindrical actuators coupled to an adjacent one of said cylindrical actuators disposed therein and coupled to an adjacent one of said cylindrical actuators disposed thereabout; and an electrical energy source coupled to said plurality of cylindrical actuators for applying actuation energy thereto in an alternating polarity fashion throughout said concentric arrangement to generate telescopic movement of said cylindrical actuators along said common longitudinal axis.

12. A telescoping actuator assembly as in claim 11, further comprising:

a first cap fixedly coupled to an end of an innermost one of said plurality of cylindrical actuators;

a second cap fixedly coupled to an end of an outermost one of said plurality of cylindrical actuators, said first cap and said second cap being disposed at opposing ends of said concentric arrangement; and a strainable element fixedly coupled to each of said first cap and said second cap, and passing longitudinally through said innermost one of said plurality of cylindrical actuators.

13. A telescoping actuator assembly as in claim 12, wherein said strainable element comprises an optical fiber.

14. A telescoping actuator assembly as in claim 12, wherein said strainable element comprises an optical fiber incorporating at least one optical element that can be tuned using mechanical strain.

15. A telescoping actuator assembly as in claim 12, wherein said strainable element comprises an optical fiber incorporating at least one Bragg grating.

* * * * *